United States Patent
Kang

(10) Patent No.: US 7,154,806 B2
(45) Date of Patent: Dec. 26, 2006

(54) CIRCUIT FOR CONTROLLING DIFFERENTIAL AMPLIFIERS IN SEMICONDUCTOR MEMORY DEVICES

(75) Inventor: Tae Jin Kang, Kyeongki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/122,692

(22) Filed: May 5, 2005

(65) Prior Publication Data

US 2006/0098514 A1  May 11, 2006

(30) Foreign Application Priority Data

Nov. 8, 2004  (KR) .................. 10-2004-0090257

(51) Int. Cl.
G11C 8/00  (2006.01)
G11C 7/02  (2006.01)
(52) U.S. Cl. .................. 365/230.03; 365/207
(58) Field of Classification Search ......... 365/230.03, 365/205, 207, 208, 189.08, 233, 226, 229
See application file for complete search history.

(56) References Cited

U.S. PATENT DOCUMENTS

| | | | |
|---|---|---|---|
| 5,528,552 A * | 6/1996 | Kamisaki ............... | 365/230.03 |
| 5,953,278 A * | 9/1999 | McAdams et al. ..... | 365/230.03 |
| 6,108,252 A | 8/2000 | Park | |
| 6,215,719 B1 | 4/2001 | Anraku | |
| 6,360,305 B1 | 3/2002 | Novak et al. | |
| 6,418,067 B1 * | 7/2002 | Watanabe et al. ...... | 365/230.03 |
| 6,424,590 B1 * | 7/2002 | Taruishi et al. ........ | 365/230.03 |
| 6,545,941 B1 | 4/2003 | Kato et al. | |
| 6,621,758 B1 * | 9/2003 | Cheung et al. ......... | 365/230.03 |
| 6,850,453 B1 | 1/2004 | Park | |
| 6,754,118 B1 * | 6/2004 | Cowles et al. ......... | 365/230.03 |
| 6,829,195 B1 * | 12/2004 | Uchida et al. ......... | 365/230.03 |

FOREIGN PATENT DOCUMENTS

| | | |
|---|---|---|
| JP | JP10162575 | 6/1998 |
| JP | JP2004039205 | 2/2004 |

* cited by examiner

*Primary Examiner*—Trong Phan
(74) *Attorney, Agent, or Firm*—Marshall, Gerstein & Borun LLP

(57) ABSTRACT

Disclosed herein is a differential amplifier control circuit in which a signal indicating that all banks are not activated is provided to a differential amplifier, so that the differential amplifier does not operate, thereby reducing unnecessary current consumption in an ICC2N situation. An all bank idle notification unit generates an all bank idle signal notifying that a plurality of banks are not activated using a plurality of bank active signals for activating the plurality of the banks. A differential amplifier controller generates a differential amplifier control signal for disabling a differential amplifier using an all bank idle signal and an internal clock signal. The differential amplifier does not operate in response to the differential amplifier control signal if the plurality of the banks is all inactivated.

16 Claims, 5 Drawing Sheets

CIRCUIT FOR CONTROLLING DIFFERENTIAL AMPLIFIERS IN SEMICONDUCTOR MEMORY DEVICES

BACKGROUND

1. Technical Field

A differential amplifier control circuit is disclosed, wherein a signal indicating that all banks are not activated is provided to a differential amplifier in order not to operate the differential amplifier.

2. Description of Related Art

In JEDEC (Joint Electron Device Engineering Council) specifications, ICC2N indicates a precharge non power down standby current when all b anks i dle, a c lock enable signal CKE is at a HIGH level, a chip select bar signal CSB is at a HIGH level, and tck=tckmin. That is, even in the ICC2N situation, a clock operates in an internal circuit of a semiconductor memory device.

FIG. 1 is a block diagram illustrating the construction of a differential amplifier control circuit in the prior art. Referring to FIG. 1, the differential amplifier control circuit 100 includes an input buffer 110, a command decoder 120, a n address buffer 130, a m ode register 140, and a differential amplifier 150.

The input buffer 110 buffers a clock signal CLK, a clock bar signal CLKB, a clock enable signal CKE, a chip select bar signal CSB, a row address strobe bar signal RASB, a column address strobe bar signal CASB, and a write enable bar signal WEB, and generates an internal clock signal ICLK and other internal signals. The command decoder 120 decodes the output signals received from the input buffer 110. The address buffer 130 buffers a row address A<i> and bank addresses BA0, BA1. The mode register 140 generates bank active signals BK0 to BK3 for activating banks 0 to 3 (160) by using the output signal of the command decoder 120 and the output signal of the address buffer 130. The differential amplifier controller 150 inputs data DT and the internal clock signal ICLK.

The differential amplifier 150 is enabled according to an internal clock signal ICLK generated from the input buffer 110. This differential amplifier 150 continues to operate while the internal clock signal ICLK is active even in the ICC2N situation. Thus, there is a problem in that current of about several hundred µA is consumed.

That is, in the ICC2N situation, all the banks are idle, but the differential amplifier 150 does not recognize the state where all the banks are idle. Therefore, the differential amplifier 150 continues to operate while the internal clock signal ICLK is active, thereby consuming the current.

SUMMARY OF THE DISCLOSURE

In view of the above problems, a differential amplifier control circuit is disclosed in which a signal indicating that all banks are inactive or deactivated is provided to a differential amplifier to deactivate the differential amplifier, thereby reducing unnecessary current consumption in an ICC2N situation.

According to an embodiment, a differential amplifier control circuit of a semiconductor memory device including a plurality of banks, comprises an all bank idle notification unit for generating an all bank idle signal, which indicates that the plurality of the banks are all deactivated, using a plurality of bank active signals; a differential amplifier controller for generating a differential amplifier control signal using the all bank idle signal and an internal clock signal; and a differential amplifier that does not operate in response to the differential amplifier control signal if the plurality of the banks are all inactivated.

DETAILED DESCRIPTION OF PRESENTLY PREFERRED EMBODIMENTS

The operational state of banks depending upon commands of JEDEC specifications will be first described. When a chip select bar signal CSB is at a LOW level, a row address strobe bar signal RASB is at a LOW level, a column address strobe bar signal CASB is at a HIGH level, and a write enable bar signal WEB is at a HIGH level in the commands of JEDEC specifications, if a bank address and a row address are applied, a row address of a corresponding bank becomes active. When the chip select bar signal CSB is at a LOW level, the row address strobe bar signal RASB is at a LOW level, the column address strobe bar signal CASB is at a HIGH level, and the write enable bar signal WEB is at a LOW level, if the bank address is applied, a corresponding bank is precharged. When the chip select bar signal CSB is at a LOW level, the row address strobe bar signal RASB is at a LOW level, the column address strobe bar signal CASB is at a HIGH level, and the write enable bar signal WEB is at a LOW level, if an row address A10 is at a HIGH level, all the banks are precharged. The term "all bank idle" indicates that all banks are not activated.

Figure 1:
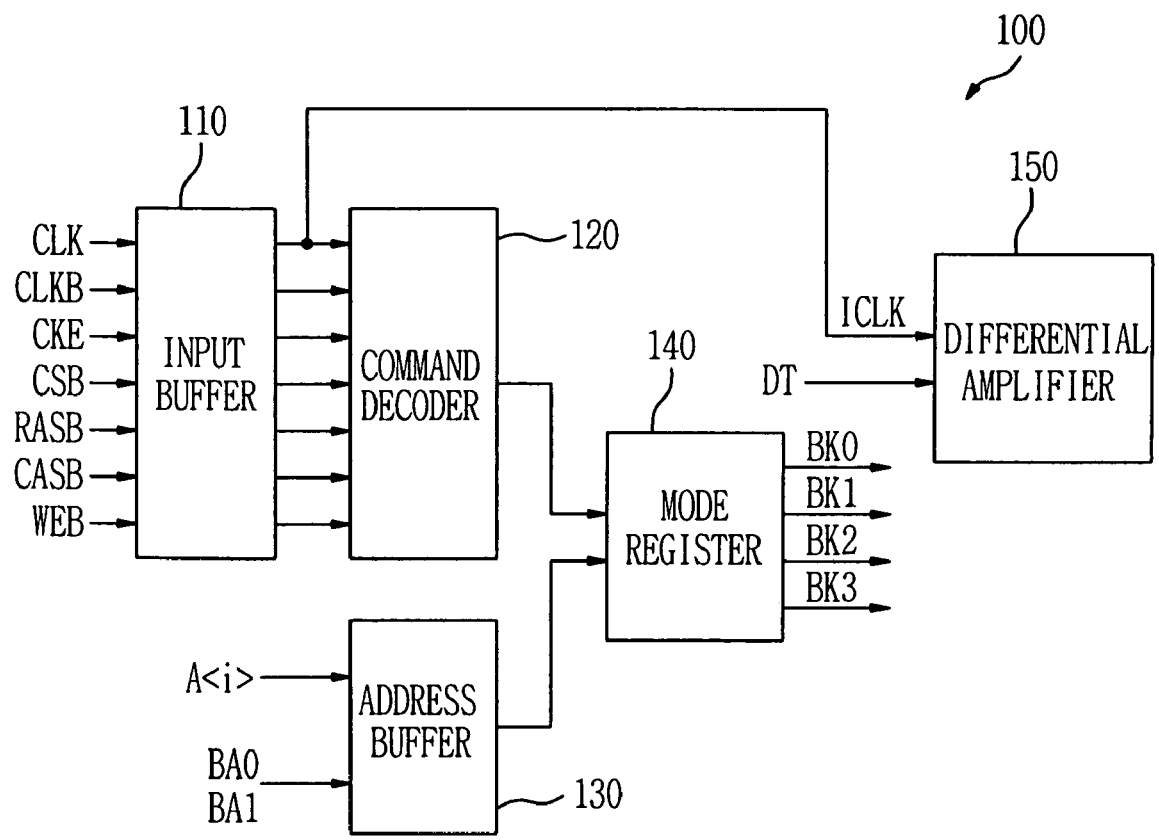
FIG. 1 is a block diagram illustrating the construction of a differential amplifier control circuit of the prior art.
Figure 2:
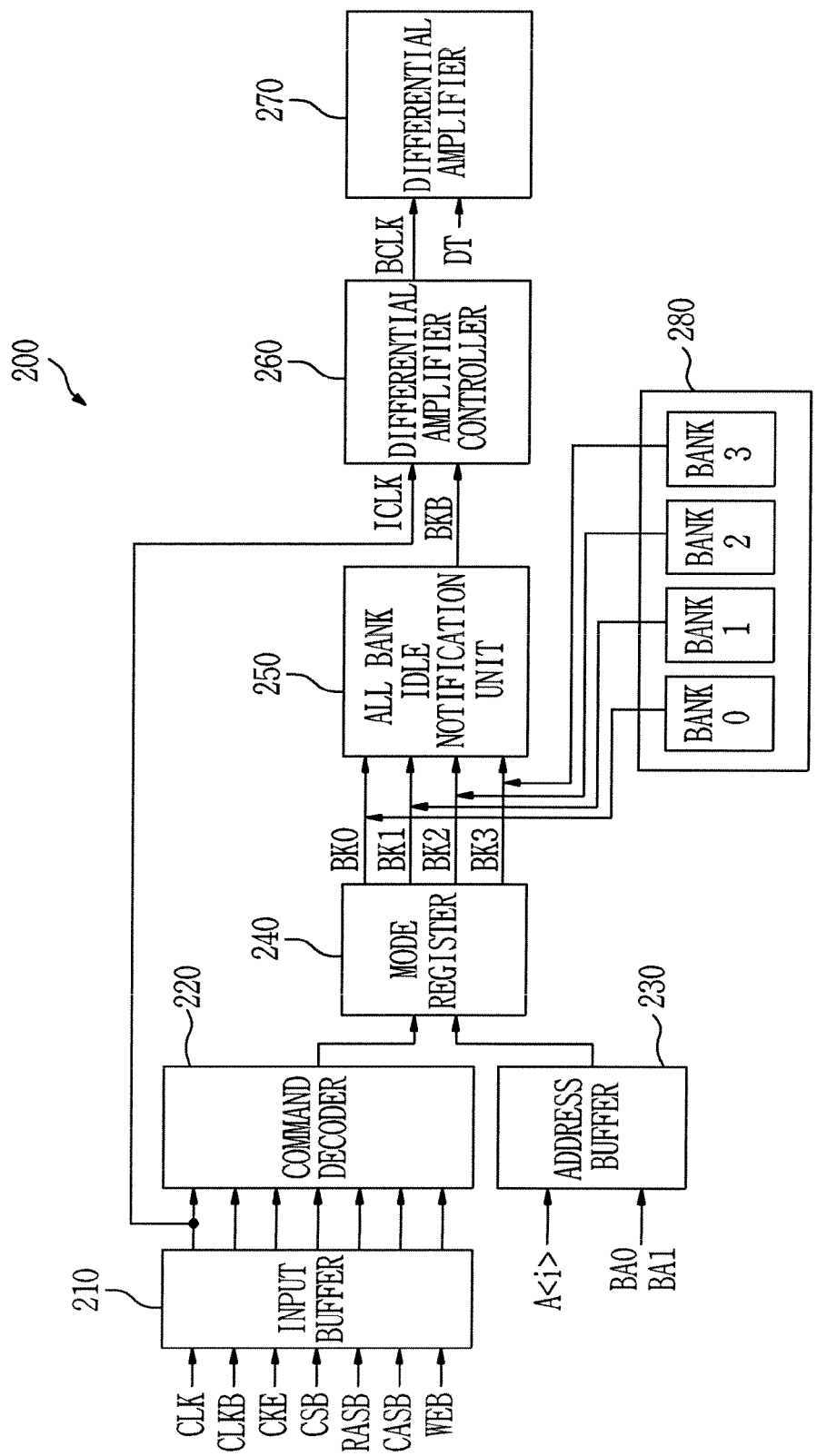
FIG. 2 is a block diagram illustrating the construction of a disclosed differential amplifier control circuit.

FIG. 2 is a block diagram illustrating the construction of a disclosed differential amplifier control circuit 200.

Referring to FIG. 2, the differential amplifier control circuit 200 comprises an input buffer 210, a command decoder 220, an address buffer 230, a mode register 240, an all bank idle notification unit 250, a differential amplifier controller 260, and a differential amplifier 270 and a bank unit 280.

The input buffer 210 buffers a clock signal CLK, a clock bar signal CLKB, a clock enable signal CKE, a chip select bar signal CSB, a row address strobe bar signal RASB, a column address strobe bar signal CASB, and a write enable bar signal WEB, and generates an internal clock signal ICLK and other internal signals. The command decoder 220 decodes the output signals received from the input buffer 210. The address buffer 230 buffers a row address A<i> and bank addresses BA0, BA1. The mode register 240 generates bank active signals BK0 to BK3 for activating banks 0 to 3 (280) by using the output signal of the command decoder 220 and the output signal of the address buffer 230. The all bank idle notification unit 250 generates an all bank idle signal BKB indicating that all banks are not activated by using the bank active signals BK0 to BK3. The differential amplifier controller 260 generates a differential amplifier control signal BCLK for disabling, i.e., not operating the differential amplifier 270 by using the all bank idle signal BKB and the internal clock signal ICLK. The differential amplifier 270 inputs data DT and is disabled in response to the differential amplifier control signal BCLK.

The operational state of banks depending upon commands of JEDEC specifications will be first described. When a chip select bar signal CSB is at a LOW level, a row address strobe bar signal RASB is at a LOW level, a column address strobe bar signal CASB is at a HIGH level, and a write enable bar signal WEB is at a HIGH level in the commands of JEDEC specifications, if a bank address and a row address are applied, a row address of a corresponding bank becomes active. When the chip select bar signal CSB is at a LOW level, the row address strobe bar signal RASB is at a LOW level, the column address strobe bar signal CASB is at a HIGH level, and the write enable bar signal WEB is at a LOW level, if the bank address is applied, a corresponding bank is precharged. When the chip select bar signal CSB is at a LOW level, the row address strobe bar signal RASB is at a LOW level, the column address strobe bar signal CASB is at a HIGH level, and the write enable bar signal WEB is at a LOW level, if an row address A10 is at a HIGH level, all the banks are precharged. The term "all bank idle" indicates that all banks are not activated.

FIGS. 3a to 3d are detailed circuit diagrams of the all bank idle notification units in which information indicating that banks are activated is indicated as a HIGH level.

Figure 3A:
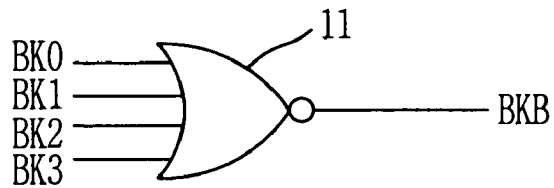
FIGS. 3a to 3d are detailed circuit diagrams of the all bank idle notification unit shown in FIG. 2.

The all bank idle notification unit shown in FIG. 3a consists of a NOR gate 11. The NOR gate 11 performs a NOR operation on the bank active signals BK0 to BK3 to output the all bank idle signal BKB.

The NOR gate 11 outputs the all bank idle signal BKB of a HIGH level when all the bank active signals BK0 to BK3 are at a LOW level, i.e., all the banks are not activated, and outputs the all bank idle signal BKB of a LOW level when any one of the bank active signals BK0 to BK3 is at a HIGH level.

The operation of the all bank idle notification unit will be further described. If a precharge signal is input after the bank active signal BK1 is input as a HIGH level, the bank active signal BK1 becomes a LOW level. At this time, the precharge signal can be one for the bank 1 or one for all the banks. If a command of the bank precharge or all the banks precharge is inputted, all the bank active signals BK0 to BK3 become a LOW level, and the all bank idle signal BKB becomes a HIGH level.

Figure 3B:
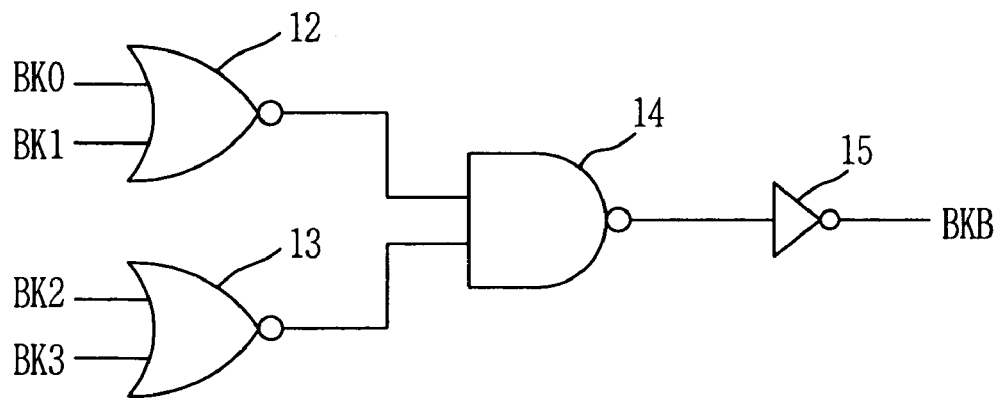

The all bank idle notification unit 250 shown in FIG. 3b comprises NOR gates 12, 13, a NAND gate 14, and an inverter 15. The NOR gate 12 performs a NOR operation on the bank active signals BK0, BK1. The NOR gate 13 performs a NOR operation on the bank active signals BK2, BK3. The NAND gate 14 performs a NAND operation on the output signals of the NOR gates 12, 13. The inverter 15 inverts the output signal of the NAND gate 14 to produce the all bank idle signal BKB.

The NOR gates 12, 13 output signals of a HIGH level, respectively, when all the bank active signals BK0 to BK3 are at a LOW level. The NAND gate 14 performs the NAND operation on the signals of the HIGH level to produce signals of a LOW level. The inverter 15 inverts the signals of the LOW level to output the all bank idle signal BKB of a HIGH level.

The all bank idle notification unit 250 shown in FIG. 3b operates in the same manner as those shown in FIG. 3a. Thus, reference to the description of FIG. 3a can be made for description of FIG. 3b.

Figure 3C:
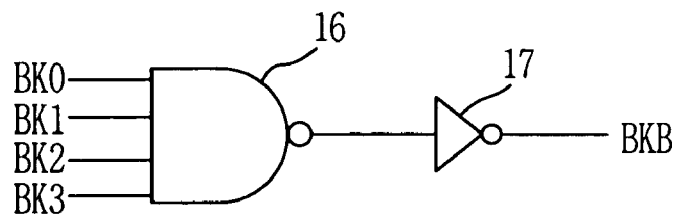
Figure 3D:
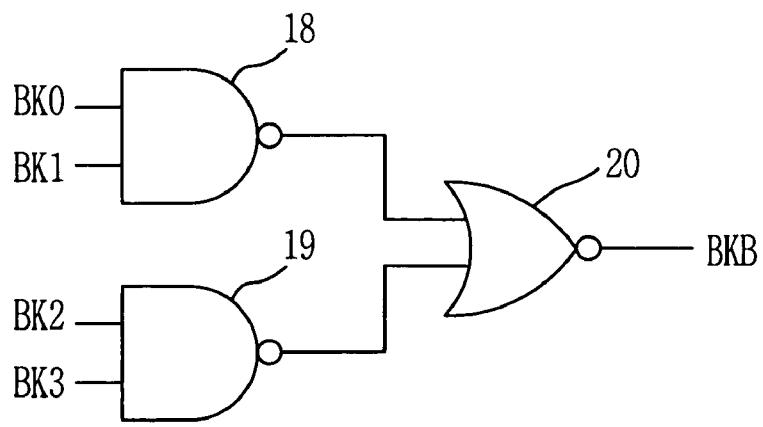

The all bank idle notification units shown in FIGS. 3c and 3d indicate information that the banks are activated as a LOW level.

The operations of FIGS. 3c and 3d are the same as those of FIGS. 3a and 3b except that information that the banks are activated is indicated as a LOW level. Thus, only the construction thereof will be described except for description.

The all bank idle notification unit shown in FIG. 3c includes a NAND gate 16 and an inverter 17. The NAND gate 16 performs a NAND operation on the bank active signals BK0 to BK3. The inverter 17 inverts the output signal of the NAND gate 16 to output the all bank idle signal BKB.

The all bank idle notification unit shown in FIG. 3d comprises NAND gates 18, 19, and a NOR gate 20. The NAND gate 18 performs a NAND operation on the bank active signals BK0, BK1. The NAND gate 19 a NAND operation on the bank active signals BK2, BK3. The NOR gate 20 a NOR operation on the output signals of the NAND gates 18, 19 to output the all bank idle signal BKB.

Figure 4A:
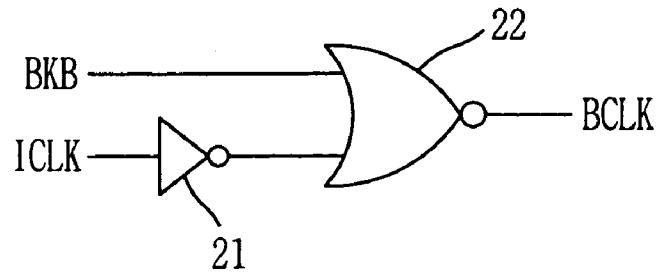
FIGS. 4a to 4c are detailed circuit diagrams of the differential amplifier controller shown in FIG. 2.
Figure 4B:
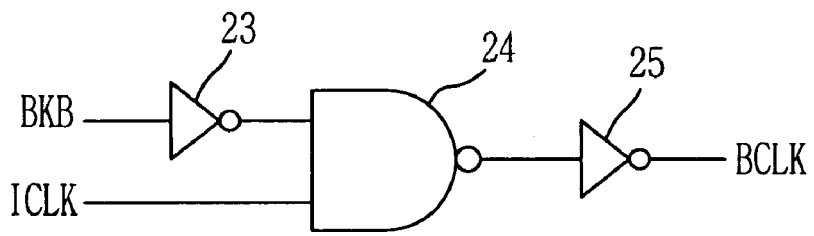
Figure 4C:
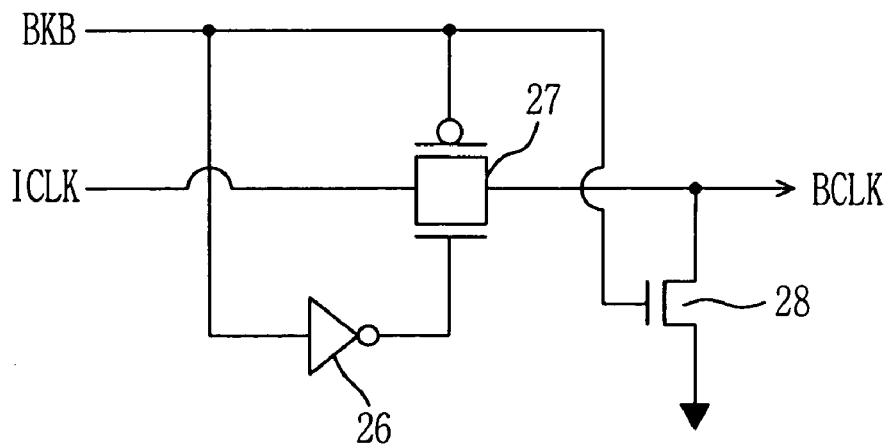

FIGS. 4a to 4c are detailed circuit diagrams of a differential amplifier controller shown in FIG. 2.

The differential amplifier controller 260 show in FIG. 4a includes an inverter 21 and a NOR gate 22. The inverter 21 inverts the internal clock signal ICLK. The NOR gate 22 performs a NOR operation on the all bank idle signal BKB and the output signal of the inverter 21 and then outputs the differential amplifier control signal BCLK.

The NAND gate 22 of FIG. 4a outputs the differential amplifier control signal BCLK of a LOW level if the all bank idle signal BKB and the internal clock signal ICLK are input as a HIGH level.

The differential amplifier controller shown in FIG. 4b includes an inverter 23, a NAND gate 24, and an inverter 25. The inverter 23 inverts the all bank idle signal BKB. The NAND gate 24 performs a NAND operation on the output signal of the inverter 23 and the internal clock signal ICLK. The inverter 25 inverts the output signal of the NAND gate 24, and then outputs the differential amplifier control signal BCLK.

The NAND gate 24 of FIG. 4b outputs a signal of a HIGH level if the all bank idle signal BKB and the internal clock signal ICLK are input as a HIGH level. The inverter 25 receives the signal of the HIGH level and then outputs the differential amplifier control signal BCLK of a LOW level.

The differential amplifier controller shown in FIG. 4c includes an inverter 26, a transfer gate 27, and a NMOS transistor 28. The inverter 26 inverts the all bank idle signal BKB. The transfer gate 27 transfers the internal clock signal ICLK under the control of the all bank idle signal BKB and the output signal of the inverter 26. The NMOS transistor 28 is connected between a ground voltage VSS and an output node, and has a gate for receiving the all bank idle signal BKB. The differential amplifier control signal BCLK is output through the output node.

If the all bank idle signal BKB is input as a HIGH level, the transfer gate 27 is turned off and the NMOS transistor 28 is turned on. The differential amplifier control signal BCLK thus outputs a signal of a LOW level.

Figure 5:
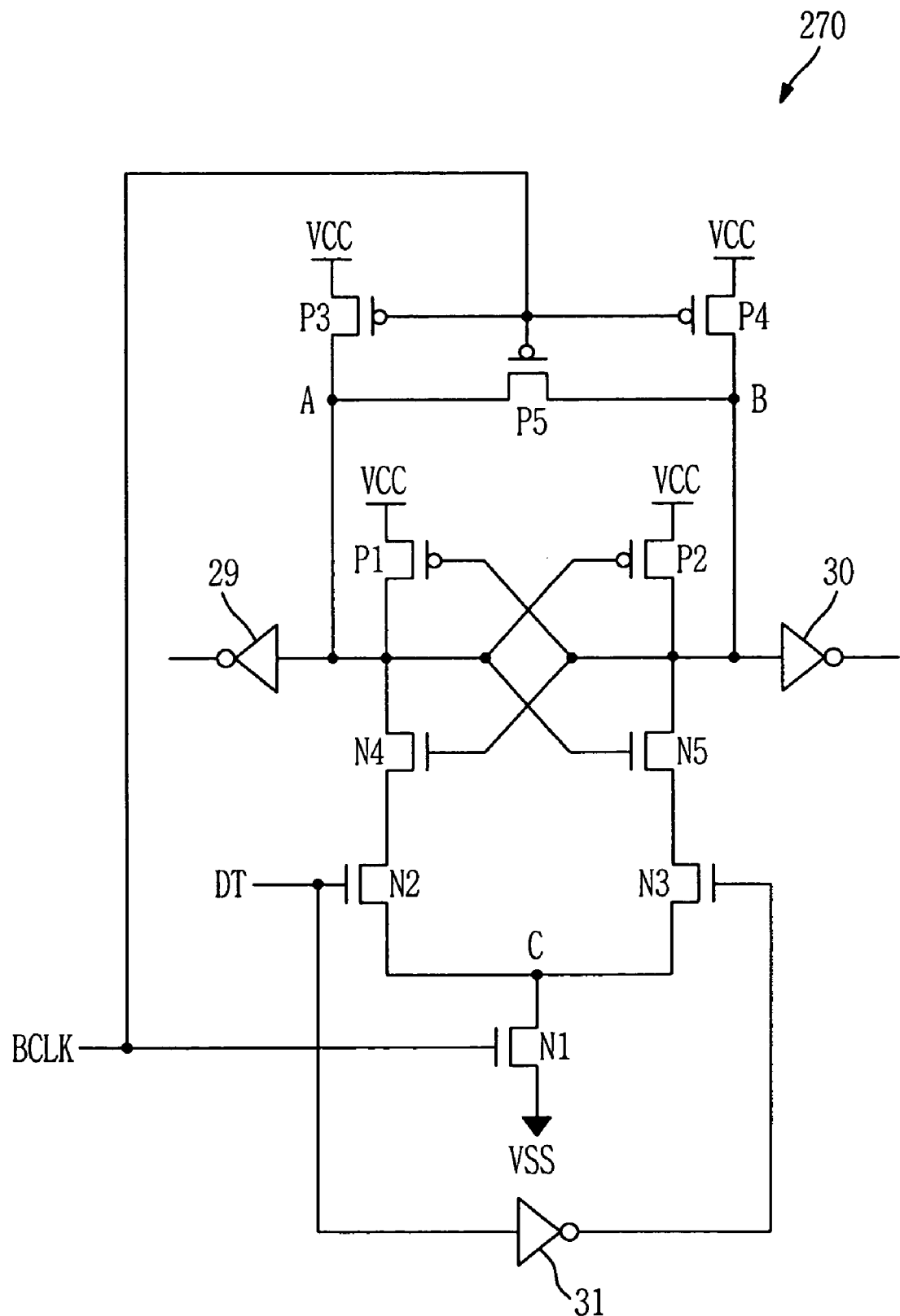
FIG. 5 is a detailed circuit diagram of the differential amplifier shown in FIG. 2.

FIG. 5 is a detailed circuit diagram of the differential amplifier shown in FIG. 2. The differential amplifier 270 includes PMOS transistors P1 to P5, NMOS transistors N1 to N5, and inverters 29, 30 and 31. The inverter 29 inverts a signal of a node A. The inverter 30 inverts a signal of a node B. The inverter 31 inverts data DT.

The PMOS transistor P3 has one terminal connected to a power source voltage VCC and the other terminal connected to the node A, and it has a gate to which the differential amplifier control signal BCLK is input. The PMOS transistor P4 has one terminal connected to a power source voltage VCC and the other terminal connected to the node B, and it has a gate to which the differential amplifier control signal BCLK is input. The PMOS transistor P5 has one terminal connected to the node A and the other terminal connected to the node B, and it has a gate to which the differential amplifier control signal BCLK is input. The PMOS transistor P1 has one terminal connected to a power source voltage VCC and the other terminal connected to the node A, and it has a gate connected to the node B. The PMOS transistor P2 has one terminal connected to a power source voltage VCC and the other terminal connected to the node B, and it has a gate connected to the node A.

The NMOS transistor N4 has one terminal connected to the node A and a gate connected to the node B. The NMOS transistor N5 has one terminal connected to the node B and a gate connected to the node A. The NMOS transistor N2 has one terminal connected to the other terminal of the NMOS transistor N4, and the other terminal connected to a node C, and it has a gate to which the data DT is input. The NMOS transistor N3 has one terminal connected to the other terminal of the NMOS transistor N5 and the other terminal connected to the node C, and it has a gate to which the output signal of the inverter 31 is input. The NMOS transistor N1 has one terminal connected to the node C and the other terminal connected to a ground voltage VSS, and it has a gate to which the differential amplifier control signal BCLK is input.

Hereinafter, the operation of the differential amplifier 270 will be described. If all the banks are in an idle state not active state, the differential amplifier control signal BCLK is input as a LOW level, the NMOS transistor N1 is turned off, the PMOS transistors P3 to P5 are turned on, and both the nodes A and B become a HIGH level. At this time, the NMOS transistor N1 is turned off at which voltage level is the data DT input. Thus, there is no change in the voltage level of the nodes A and B. Further, the NMOS transistors N4, N5 are turned on.

That is, in the ICC2N situation, since the differential amplifier control signal BCLK of a LOW level, which indicates an all bank idle state, is input to the differential amplifier 270, the NMOS transistor N1 is turned off. Although which data is input, the differential amplifier 270 does not operate. For this reason, the differential amplifier 270 does not consume the current in the ICC2N conditions.

If one of the plurality of the banks is activated, the differential amplifier control signal BCLK is input as a HIGH level. At this time, if the data DT is received as a HIGH level, the PMOS transistors P3 to P5 are turned off, the NMOS transistors N1, N2 are turned on, and the NMOS transistor N3 is turned off. As described above, since the NMOS transistor N4 is turned on when the differential amplifier control signal BCLK is at a LOW level, the node A becomes the ground voltage VSS, i.e., a LOW level. The NMOS transistor N5 is turned off, the PMOS transistor P2 is turned on, and the node B becomes a HIGH level.

That is, if any one of the plurality of the banks is activated, the differential amplifier control signal BCLK is input as a HIGH level. As the NMOS transistor N1 is turned on, the differential amplifier 270 operates.

As described above, a signal indicating that all banks are not activated, such as an all bank idle signal, is provided to a differential amplifier in order not to operate the differential amplifier. Therefore, there is an advantage in that a differential amplifier does not consume current in an ICC2N situation, i.e., when all banks are in an idle state.

Further, by reducing the current of ICC2N, power consumption can be saved in mobile electronic devices. Accordingly, there is an advantage in that the lifespan of the battery of the mobile electronic devices can extend.

Although the foregoing description has been made with reference to the preferred embodiments, it is to be understood that changes and modifications may be made by one of ordinary skill in the art without departing from the spirit and scope of this disclosure and the appended claims.

What is claimed is:

1. A semiconductor memory device including a plurality of banks, the device comprising:
   an all bank idle notification unit for generating an all bank idle signal indicating the plurality of the banks are deactivated, using a plurality of bank active signals;
   a differential amplifier controller for generating a differential amplifier control signal using the all bank idle signal and an internal clock signal; and
   a differential amplifier that is inoperative in response to the differential amplifier control signal if the plurality of the banks are deactivated.

2. The semiconductor memory device as claimed in claim 1, wherein the all bank idle notification unit activates the all bank idle signal when the plurality of the bank active signals are all deactivated.

3. The semiconductor memory device as claimed in claim 1, wherein the differential amplifier controller does not activate the differential amplifier control signal if the all bank idle signal and the internal clock signal become active.

4. The semiconductor memory device as claimed in claim 1, wherein the differential amplifier does not operate when the differential amplifier control signal is not activated.

5. The semiconductor memory device as claimed in claim 1, wherein the all bank idle notification unit comprises a logic element for logically combining the plurality of the bank active signals.

6. The semiconductor memory device as claimed in claim 1, wherein the all bank idle notification unit comprises:
   a first logic element for logically combining some of the plurality of the bank active signals;
   a second logic element for logically combining the other of the plurality of the bank active signals;
   a third logic element for logically combining the output signals of the first and second logic elements; and
   an inverse element for inverting the output signal of the third logic element to output the all bank idle signal.

7. The semiconductor memory device as claimed in claim 5, wherein the all bank idle notification unit indicates a state where the plurality of the banks are activated as a HIGH level.

8. The semiconductor memory device as claimed in claim 1, wherein the all bank idle notification unit comprises:
   a logic element for logically combining the plurality of the bank active signals; and
   an inverse element for inverting the output signal of the logic element to output the all bank idle signal.

9. The semiconductor memory device as claimed in claim 1, wherein the all bank idle notification unit comprises:
   a first logic element for logically combining some of the plurality of the bank active signals;
   a second logic element for logically combining the other of the plurality of the bank active signals; and
   a third logic element for logically combining the output signals of the first and second logic elements to output the all bank idle signal.

10. The semiconductor memory device as claimed in claim 8, wherein the all bank idle notification unit indicates a state where the plurality of the banks are activated as a LOW level.

11. The semiconductor memory device as claimed in claim 1, wherein the differential amplifier controller comprises a logic element for logically combining the all bank idle signal and an inverse signal of the internal clock signal, and then outputting the differential amplifier control signal.

12. The semiconductor memory device as claimed in claim 1, wherein the differential amplifier controller comprises:
- a logic element for logically combining an inverse signal of the all bank idle signal and the internal clock signal; and
- an inverse element for inverting the output signal of the logic element to output the differential amplifier control signal.

13. The semiconductor memory device as claimed in claim 1, wherein the differential amplifier controller comprises:
- a transfer gate for transferring the internal clock signal under the control of an inverse signal of the all bank idle signal and the all bank idle signal; and
- a switching element having one terminal connected to an output node and the other terminal connected to a ground voltage, and having a gate to which the all bank idle signal is input, the differential amplifier control signal being output through the output node.

14. A differential amplifier control circuit of a semiconductor memory device including a plurality of banks and a differential amplifier, the differential amplifier control circuit comprising:
- an all bank idle notification unit for notifying that the plurality of the banks are deactivated; and
- a differential amplifier controller for deactivating the differential amplifier using an output signal of the all bank idle notification unit and an internal clock signal if the plurality of the banks are deactivated.

15. The differential amplifier control circuit as claimed in claim 14, wherein the all bank idle notification unit notifies that the plurality of the banks are deactivated using a plurality of bank active signals for activating the plurality of the banks.

16. The differential amplifier control circuit as claimed in claim 14, wherein the differential amplifier controller does not operate the differential amplifier if the output signal of the all bank idle notification unit and the internal clock signal are activated.

* * * * *